(12) United States Patent  
Nagata et al.

(10) Patent No.: US 7,016,242 B2  
(45) Date of Patent: Mar. 21, 2006

(54) SEMICONDUCTOR MEMORY APPARATUS AND SELF-REPAIR METHOD

(75) Inventors: Kou Nagata, Kanagawa (JP); Hiroaki Kodama, Chiba (JP)

(73) Assignee: Sony Corporation, (JP)

( * ) Notice: Subject to any disclaimer, the term of this patent is extended or adjusted under 35 U.S.C. 154(b) by 0 days.

(21) Appl. No.: 10/823,572

(22) Filed: Apr. 14, 2004

(65) Prior Publication Data

US 2005/0007841 A1    Jan. 13, 2005

(30) Foreign Application Priority Data

May 1, 2003 (JP) ............................ P2003-126520

(51) Int. Cl.
*G11C 29/00*  (2006.01)
*G11C 19/00*  (2006.01)

(52) U.S. Cl. ....................... 365/200; 365/201; 365/240
(58) Field of Classification Search ................ 365/200, 365/201, 225.7, 240
See application file for complete search history.

(56) References Cited

U.S. PATENT DOCUMENTS

| | | | |
|---|---|---|---|
| 6,181,614 B1 * | 1/2001 | Aipperspach et al. | 365/225.7 |
| 6,205,064 B1 * | 3/2001 | Ooishi | 365/200 |
| 6,259,637 B1 * | 7/2001 | Wood et al. | 365/200 |
| 6,421,286 B1 * | 7/2002 | Ohtani et al. | 365/201 |
| 6,667,917 B1 * | 12/2003 | Templeton et al. | 365/201 |

FOREIGN PATENT DOCUMENTS

| | | |
|---|---|---|
| JP | 07-146340 | 6/1995 |
| JP | 2002-117697 | 4/2002 |

* cited by examiner

*Primary Examiner*—Trong Phan  
(74) *Attorney, Agent, or Firm*—Rader, Fishman & Grauer PLLC; Ronald P. Kananen

(57) ABSTRACT

In a memory unit provided by the present invention, unit blocks are laid out to form a block matrix. Each of the unit blocks has a plurality of memory cells arranged to form a cell matrix and a redundant line including a redundant memory cell. A plurality of unit blocks in the block matrix forms a one-dimensional group oriented in a first or second direction so that unit blocks pertaining to each one-dimensional group share a redundant line. Self-repair means embedded in the same chip as the memory unit stores only a minimum number of address pairs required for determining a redundant line to be used for repairing an abnormal memory cell for each unit block in storage means. The address of the redundant line to be used for repairing an abnormal memory is then found for each unit block on the basis of the minimum number of address pairs stored in the storage means. By storing only minimum required address information as such, a small size of the storage means and, hence, small circuit scales are sufficient. In addition, since a repair search is carried out by the embedded self-repair means in the same chip as the memory unit, the repair search can be carried out at a high processing speed.

13 Claims, 9 Drawing Sheets

FIG. 5

| EXISTENCE BIT | X MASK BIT | XD BIT | X ADDRESS | Y ADDRESS | YD BIT | Y MASK BIT |
|---|---|---|---|---|---|---|
| 1 | 0 | 0 | 12 | 5 | 0 | 0 |
| 1 | 0 | 0 | 6 | 5 | 1 | 1 |
| 1 | 1 | 1 | 12 | 8 | 0 | 0 |
| 1 | 0 | 0 | 5 | 35 | 0 | 0 |
| 1 | 0 | 1 | 6 | 35 | 1 | 0 |

OVERFLOW
0

F I G. 8
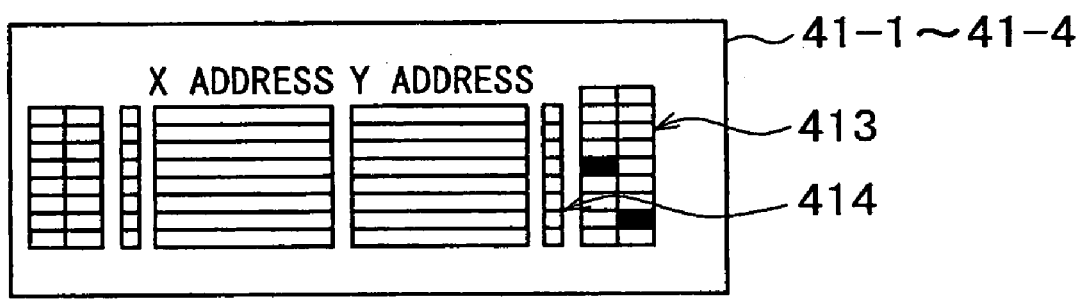

SEMICONDUCTOR MEMORY APPARATUS AND SELF-REPAIR METHOD

BACKGROUND OF THE INVENTION

The present invention relates to a semiconductor memory apparatus such as a DRAM (Dynamic Random Access Memory) or an SRAM (Static Random Access Memory) as well as relates to a self-repair method adopted in the semiconductor memory apparatus. More particularly, the present invention relates to a semiconductor memory apparatus having a redundancy search circuit for replacing a bad (defective) memory cell with a redundant memory cell included in the semiconductor memory apparatus in advance as well as relates to a self-repair method adopted in the semiconductor memory apparatus.

In a semiconductor memory apparatus such as a DRAM, the integration scale is extremely large and, in consequence, the yield becomes a problem. Practically, it is almost impossible to increase the yield to 100% so that one may assume that a defective memory cell always exists in a semiconductor memory apparatus. A defective memory cell is also referred to hereafter as an abnormal bit. If a defective memory cell exists in a semiconductor memory apparatus, however, the apparatus cannot of course be shipped as a product.

In order to solve the problem described above, in actuality, some spare memory cells are provided in advance and, if a defective memory cell is detected, the defective cell is replaced with one of the spare memory cells to rescue the semiconductor memory apparatus. To put it concretely, spare memory cells are redundantly provided to form a redundant line and, if a defective memory cell exists, a bit or address line including the defective memory cell is replaced with the redundant line. In the case of the conventional semiconductor memory apparatus, a memory cell is determined to be normal or defective at a stage of shipping the memory apparatus from the factory by using a memory tester external to the semiconductor memory apparatus at the factory.

In the mean time, LSI technologies have been improved substantially in recent years. With the improvement of the LSI technologies, the number of apparatuses, in which a plurality of memories coexists with logic circuits in the same LSI chip, increases. It is thus practically difficult to test the individual memories of the same LSI chip independently of each other. In addition, as the operating speed of the LSI chip becomes higher, it becomes difficult to evaluate the performance of a memory by using an external memory tester. For these reasons, a memory-testing method embedded in an LSI chip is indispensable to the chip. In addition, even if a memory can be tested by using an external memory tester, such a memory tester is extremely expensive. Thus, since the cost of testing a memory in a fabrication process has been increasing considerably in recent years, it is desirable to provide a method, which allows an LSI a memory to be tested at a high speed equal to the operating speed of the LSI chip and can be implemented at a low cost.

With regard to the testing and evaluation of a semiconductor memory apparatus, as described earlier, each bit or each memory cell in an LSI chip is evaluated to determine whether the bit or the cell is normal or defective. A portion embedded in the LSI chip as a portion for evaluating memory cells is generally referred to as a BIST (Built-In Self Test) circuit. In the current situation, test circuits available in the market are mostly provided for SRAMs, and each manufacturer is developing a DRAM-oriented test circuit suitable for the original DRAM architecture of the manufacturer.

The BIST circuit determines whether or not an abnormal (defective or bad) bit (memory cell) exists in a memory and, if an abnormal bit exists, determines what address the bit is located at. A semiconductor memory apparatus includes a dummy bit or word line to restore the abnormal bit detected by the BIST circuit. The dummy bit or word line is referred to as a redundant line. The BIST circuit carries out processing only to find an abnormal bit. Thus, a later process determines how a redundant line is actually used.

A plurality of redundant lines is provided in the column and row directions. It is therefore necessary to determine how an abnormal bit is to be interpolated by using a redundant line and which redundant line is to be used for interpolating the abnormal bit. The work to interpolate an abnormal bit by using a redundant line as such is referred to as a repair and the work to determine which redundant line is to be used for interpolating an abnormal bit is referred to as a repair search. The work to actually complete a repair after determining a mask address in an LSI chip is referred to as a BISR (Built-In Self-Repair) or merely a self-repair.

If an external memory tester is used, a repair-search calculation is carried out by using a computer employed in the external memory tester. For more information, refer to documents such as patent reference 1. Besides the evaluation function to determine whether or not an abnormal bit exists, a repair-search (redundancy-analysis) function is added to the BIST circuit embedded in an LSI chip. The repair-search (redundancy-analysis) function is a function to determine which redundant line is to be used for interpolating an abnormal bit. For more information, refer to documents such as patent reference 2.

[Patent Document 1]
Japanese Patent Laid-open No. Hei 7-146340

[Patent Document 2]
Japanese Patent Laid-open No. 2002-117697

Even in the case of an LSI chip including an embedded BIST circuit, however, a problem remains to be solved if the chip is tested in a configuration wherein information on normality/abnormality for each bit is transferred to a memory of an external computer and the external computer is used for carrying out a repair-search calculation as is the case with the conventional technology disclosed in patent reference 1. This is because a memory with a large storage capacity for storing the information on normality/abnormality for each bit is required of the external computer and it takes very long time to carry out the calculation.

Even if the BIST circuit embedded in the LSI chip is provided with a repair-search function as is the case with the conventional technology disclosed in patent reference 2, a plurality of repairable combination types is conceivable. In an example given in the reference, the number of repairable combination types is 6. This technology adopts a technique whereby a storage location for storing addresses for all these combinations is provided and repair possibility for all the 6 types is verified at the same time. Thus, the scale of the circuit conceivably increases.

SUMMARY OF THE INVENTION

It is thus an object of the present invention addressing the problems described above to provide a semiconductor memory apparatus capable of carrying out a repair search at a high speed but at a small circuit scale in a configuration providing a BIST circuit embedded in the semiconductor memory apparatus with a repair-search function or, in particular, a configuration for sharing a redundant line in a direction (a one-way spit-form direction), and provides a self-repair method capable of carrying out a self repair completely on the chip of the semiconductor memory apparatus.

A semiconductor memory apparatus provided by the present invention is characterized in that the semiconductor memory apparatus includes:

a memory unit having unit blocks each including:
a memory core including a plurality of memory cells laid out to form a cell matrix; and
redundant lines including redundant memory cells each used for repairing an abnormal memory cell generated in any of the memory cores,
wherein:
the unit blocks are further laid out to form a block matrix or a plurality of block matrixes, and every plurality of unit blocks forms a one-dimensional group oriented in a first direction (row or column direction) or a second direction (column or row direction); and
the redundant lines are shared by the unit blocks pertaining to the one-dimensional group;

self-test means mounted in the same chip as the memory unit to serve as embedded self-test means for evaluating the memory cells in order to determine whether the memory cells are good or defective; and self-repair means mounted in the same chip as the memory unit to serve as embedded self-repair means for:
selecting only a minimum number of address pairs among address pairs received from the embedded self-test means as address pairs each including a first-direction address (row or column address) and second-direction address (column or row address) of an abnormal memory cell;
storing the selected minimum number of address pairs in first storage means for each of the unit blocks as address pairs required for determining a redundant line to be used for repairing an abnormal memory cell; and
finding a redundant line to be used for repairing an abnormal memory cell for each of the unit blocks on the basis of address pairs stored in the first storage means.

The minimum number of address pairs required for determining a redundant line to be used for repairing an abnormal memory cell is explained by giving an example as follows. Assume that the number of redundant lines connected in the row direction is m and the number of redundant lines connected in the column direction is n. In this case, it is sufficient to provide the first storage means with a buffer having a size of 2×m×n, total, address pairs as a memory for storing the address pairs cited above.

In the semiconductor memory apparatus described above, the memory unit includes unit blocks laid out to form a matrix. Each of the unit blocks has a plurality of memory cells laid out to form a cell matrix and redundant lines including redundant memory cells. Every plurality of unit blocks forms a one-dimensional group oriented in a first direction (row or column direction) or a second direction (column or row direction) and the redundant lines are shared by the unit blocks pertaining to the one-dimensional group. The embedded self-test means evaluates the memory cells in order to determine whether the memory cells are good or defective and supplies information on addresses of abnormal memory cells to the embedded self-repair means. Receiving the information on addresses of abnormal memory cells, the embedded self-repair means selects only a minimum number of address pairs from the information, stores the selected minimum number of address pairs in first storage means for each of the unit blocks as address pairs required for determining a redundant line to be used for repairing an abnormal memory cell and finds a redundant line to be used for repairing an abnormal memory cell for each of the unit blocks on the basis of address pairs stored in the first storage means. Since only a minimum amount of required memory is stored as such, a small size of a buffer employed in the first storage means is sufficient. Thus, the circuit scale can also be reduced.

As described above, in accordance with the present invention, redundant lines are used in a structure where the redundant lines are shared by a plurality of redundant blocks laid out in a one-dimensional direction. In this case, the mask address of a redundant line can be determined in an on-chip process. With such an on-chip process, an abnormal bit can be repaired not only at the time the chip is shipped from the factory, but also after the chip is delivered to the user as a product by carrying out the BISR function typically at the time the power supply is turned on. Thus, the present invention exhibits an effect to increase the probability of rescuing the chip from abnormal bits.

In addition, by storing information obtained as a result of evaluation of individual memory cells to determine whether the memory cells are good or defective in a buffer as minimum address information required for determining redundant lines each to serve as a substitute for an abnormal memory cell, the BISR function can be implemented by using a small size of the buffer and a small circuit scale in comparison with a case in which all address information obtained as the evaluation result is stored in a buffer. In addition, since a repair search is carried out in the same chip as the memory unit, the repair search can be carried out at a high processing speed.

BRIEF DESCRIPTION OF THE DRAWINGS

FIG. 5 is a diagram concretely showing a result of a process carried out by the repair search circuit;

FIG. 8 is a block diagram concretely showing a typical configuration of a buffer unit implemented by a third embodiment.

PREFERRED EMBODIMENTS OF THE INVENTION

Preferred embodiments of the present invention are described in detail by referring to the diagrams as follows.

Figure 1:
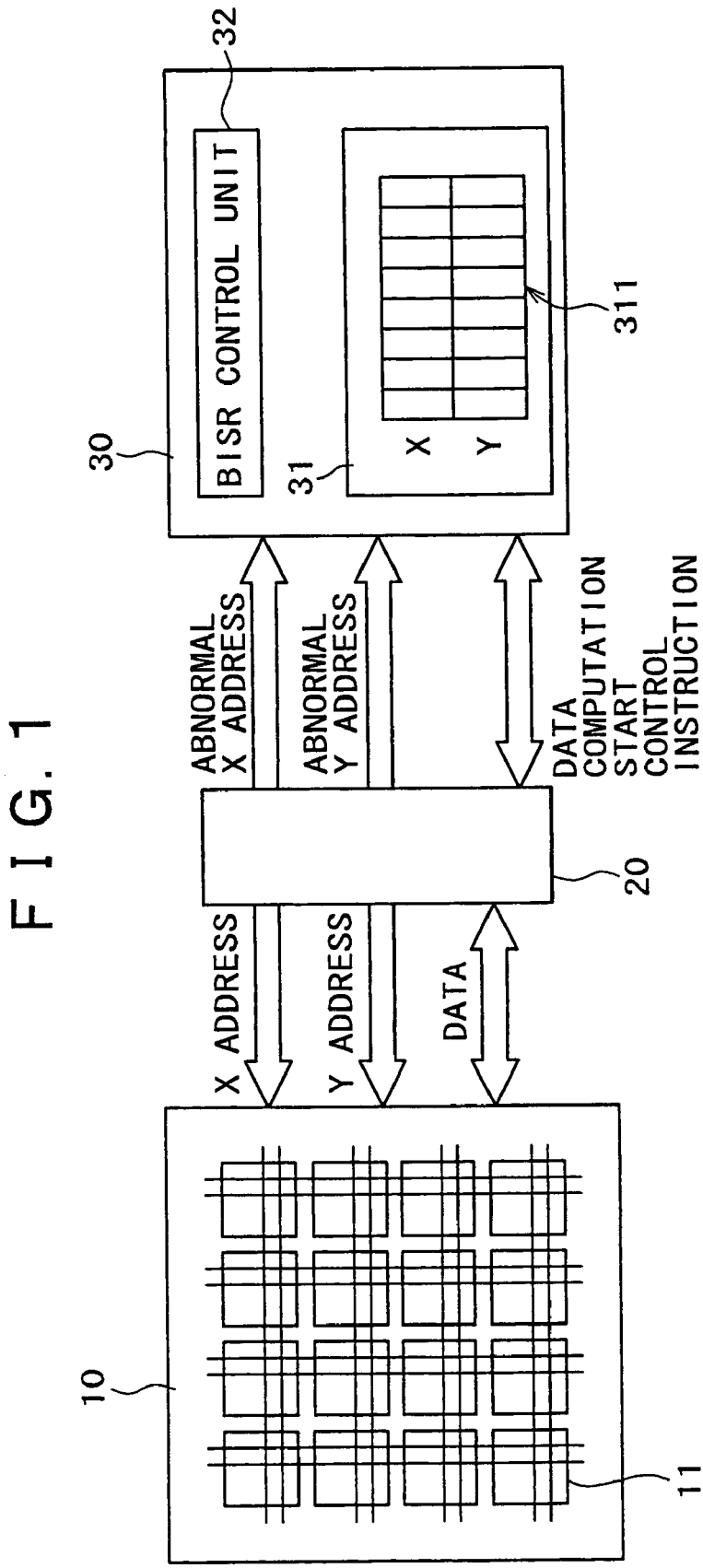
FIG. 1 is a block diagram showing the configuration of a semiconductor memory apparatus implemented by an embodiment of the present invention.

FIG. 1 is a block diagram showing a typical configuration of a semiconductor memory apparatus implemented by an embodiment of the present invention. As is obvious from FIG. 1, the semiconductor memory apparatus implemented by the embodiment as an LSI chip includes a RAM (or memory unit) 10 such as a DRAM or an SRAM, a BIST (Built-In Self-Test) circuit 20 and a BISR (Built-In Self-Repair) circuit 30. The RAM 10, the BIST circuit 20 and the BISR circuit 30 are included in the same LSI chip.

Figure 2:
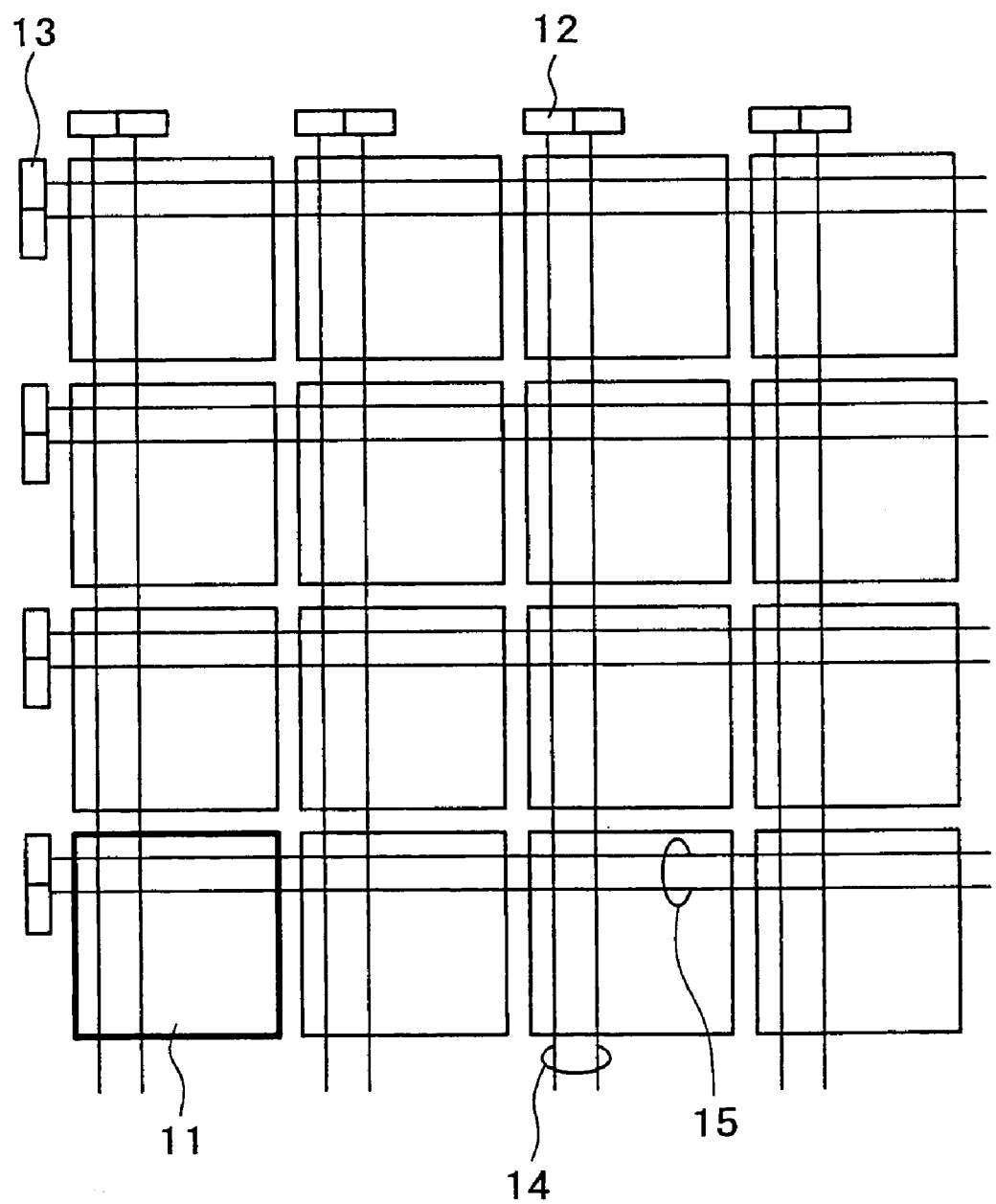
FIG. 2 is a block diagram showing a typical configuration of a RAM.

As shown in FIG. 2, the RAM 10 generally includes small unit blocks 11 having a memory core, which includes a plurality of memory cells laid out to form a matrix, and redundant lines each including memory cells. The memory cells included in a redundant line are each used for repairing an abnormal memory cell generated in a memory core. The small unit blocks 11 are each referred to hereafter as a redundant block 11. A number of such redundant blocks 11 is also arranged to form a plurality of matrixes. In some cases, the redundant blocks 11 are arranged to form a matrix. Ideally, mechanical fuses 12 and 13 of wires made of a material such as Al (aluminum) are on the row and column of redundant blocks 11 so that the redundant blocks 11 can be used in a repair independently.

Figure 3:
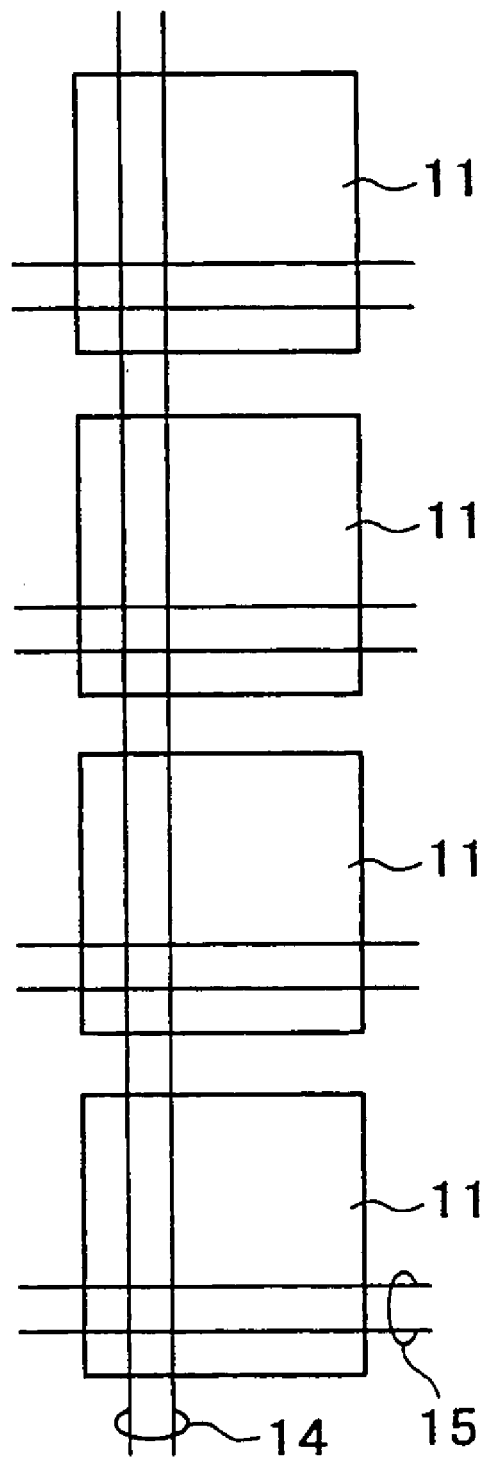
FIG. 3 is a block diagram showing a configuration in which 2 redundant lines are connected to all redundant blocks in a Y direction (or a spit-form direction) and 2 redundant lines are connected to each of the redundant blocks in an X direction.

In actuality, however, the mechanical fuses 12 and 13 have a large size, raising a mounting problem. In order to solve this problem, row and column redundant lines are used by being shared by a plurality of redundant blocks 11 included in a group to provide a configuration in which each group has mechanical fuses 12 and 13. In the semiconductor memory apparatus implemented by this embodiment, it is assumed that the semiconductor memory apparatus has a configuration in which redundant blocks 11 are grouped in a one-dimensional direction, and the grouped redundant blocks 11 use a shared redundant line as shown in FIG. 3. In the configuration shown in the figure, the shared redundant line is a row redundant line 14.

The BIST circuit 20 evaluates each memory cell in the RAM 10 of the configuration described above to evaluate whether or not the memory cell is normal or defective. To put it concretely, the BIST circuit 20 inspects each redundant block 11 to determine whether or not an abnormal bit (a defective or bad memory cell) exists in the redundant block 11. If an abnormal bit exists in a redundant block 11, the BIST circuit 20 determines what address the abnormal bit is located at at a high LSI operating speed. Information on the address of the abnormal bit detected by the BIST circuit 20 is supplied to the BISR circuit 30.

In order to implement the repair function, the BISR circuit 30 is designed into a configuration including a repair-search circuit 31 and a BISR control unit 32. In the BISR circuit 30, the repair-search circuit 31 processes the information supplied by the BIST circuit 20 as information on the address of the abnormal bit in a real-time manner. The repair-search circuit 31 confirms a smallest amount of address information required for determining which redundant line (or a redundant memory cell) is to be used as a replacement of the abnormal bit. A buffer (memory) unit 311 is provided in the LSI chip as storage means for storing only this smallest amount of address information on addresses. The information on the address of an abnormal bit is expressed in terms of a pair of row and column addresses. The addresses composing the pair is referred to as X and Y addresses.

The following description explains a series of processes in which the BIST circuit 20 inspects each redundant block 11 in order to determine whether or not an abnormal bit exists in the redundant block 11 at the LSI operating speed and the repair-search circuit 31 carries out processing on information on the address of the abnormal bit in a real-time manner, storing the information in the buffer unit 311. The description begins with consideration of the storage capacity of the buffer unit 311 required for storing information on addresses in the LSI chip. The storage capacity of the buffer unit 311 is referred to simply as a buffer size. It is to be noted that address information stored in the buffer unit 311 is expressed in terms of a pair of X and Y addresses.

Let notations m and n denote the number of usable redundant lines in the X direction and the Y direction respectively where the X direction is the direction of the X axis whereas the Y direction is the direction of the Y axis. In this case, if at least (n+1) abnormal bits exist at a Y address, the line of this Y address must be replaced with a redundant line in the X direction unconditionally. By the same token, if at least (m+1) abnormal bits exist at an X address, the line of this X address must be replaced with a redundant line in the Y direction unconditionally.

Thus, a buffer size of m pairs is a sufficient buffer size required for 1 redundant line in the Y direction. By the same token, a buffer size of n pairs is an adequate buffer size required for 1 redundant line in the X direction. The reasoning leading to such buffer sizes is explained as follows. Consider a redundant line in the Y direction and think of pairs of abnormal addresses. If Y addresses with the same X address are abnormal, up to m pairs need to be stored in the buffer unit 311. This is because, when the (m+1)th address becomes abnormal, the X address is confirmed as a repair address so that it is not necessary to store the (m+1)th pair. This reasoning applies to a redundant line in the X direction.

Thus, since there are m redundant lines in the X direction, the buffer size required for all the redundant lines in the X direction is m×n. By the same token, since there are n redundant lines in the Y direction, the buffer size required for all the redundant lines in the Y direction is n×m. Thus, a total buffer size of 2×m×n pairs is sufficient.

Take a configuration of the RAM 10 shown in FIG. 3 as an example. In this typical configuration, both m and n are 2. That is to say, the number of row redundant lines 14 and the number of column redundant lines 15 are both 2. In the case of this typical configuration, a buffer unit 311 having a buffer size of 8 (=2×2×2) pairs of X and Y addresses per redundant block 11 is adequate for the repair-search circuit 31.

Figure 4:
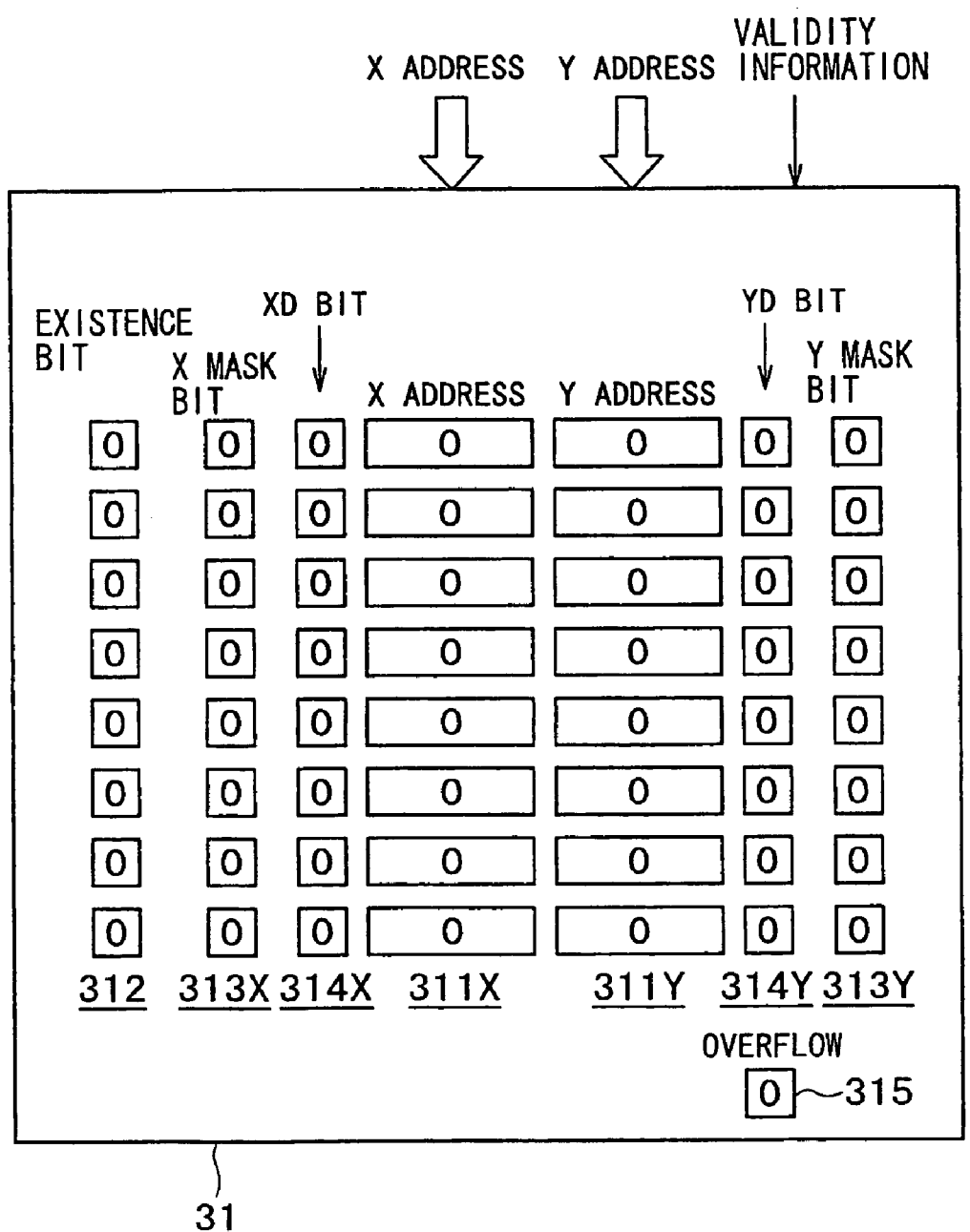
FIG. 4 is a block diagram concretely showing a typical configuration of a repair search circuit.

FIG. 4 is a block diagram showing a concrete configuration of the repair-search circuit 31. The repair-search circuit 31 of this embodiment has a buffer unit 311 including 8 X-address storage locations 311X and 8 Y-address storage locations 311Y for the 2 row redundant lines 14 and the 2 column redundant lines 15. In addition, the repair-search circuit 31 includes 8 existence bits 312, mask bits 313, D bits 314 and an overflow bit 315. In actuality, the mask bits 313 are 8 X mask bits 313X and 8 Y mask bits 313Y. By the same token, the D bits 314 are 8 XD bits 314X and 8 YD bits 314Y.

Associated with a particular one of the X-address storage locations 311X and a particular one of Y-address storage locations 311Y, each of the existence bits 312 has a value of either 1 indicating that a pair of addresses has been stored at the particular X-address storage location 311X and the particular Y-address storage location 311Y, or 0 indicating that the pair of addresses has not been stored therein. The overflow bit 315 has either a value of 0 indicating a state of being repairable by using the redundant lines 14 and 15 or a value of 1 indicating a state of being unrepairable by using the redundant lines 14 and 15. Associated with a particular one of the X-address storage locations 311X, each of the X mask bits 313X in a set state indicates that the X address stored at the particular X-address storage location 311X has been confirmed as a mask address (repair address) to be described later. By the same token, associated with a particular one of the Y-address storage locations 311Y, each of the Y mask bits 313Y in a set state indicates that the Y address stored at the particular Y-address storage location 311Y has been confirmed as a mask address (repair address). Associated with a particular one of the X-address storage locations 311X, each of the XD bits 314X in a set state indicates that the X address stored at the particular X-address storage location 311X was already recorded before at another X-address storage location 311X or is recorded for the second or subsequent time. By the same token, associated with a particular one of the Y-address storage locations 311Y, each of the YD bits 314Y in a set state indicates that the Y address stored at the particular Y-address storage location 311Y was already recorded before at another Y-address storage location 311X or is recorded for the second or subsequent time. That is to say, the XD bits 314X and the YD bits 314Y are each a duplication bit.

The BIST circuit 20 supplies X and Y addresses and validity-bit information to the repair-search circuit 31 shown in FIG. 4. The X and Y addresses indicate the position of an abnormal bit in the RAM 10 whereas the validity-bit information shows that the supplied X and Y addresses are valid. If the supplied X and Y addresses are valid, the repair-search circuit 31 carries out processes (1) to (5) described as follows.

(1) When a pair of X and Y addresses is received, the repair-search circuit 31 determines whether or not the address pair has been stored at any pair of address storage locations 311X and 311Y provided for X and Y addresses respectively. If the address pair has been stored at any pair of address storage locations 311X and 311Y, the address pair is discarded.

(2) The X mask bit 313X is examined to determine whether or not the value thereof is 1 indicating that the supplied X address has been confirmed as an address to be masked (to undergo a repair). By the same token, the Y mask bit 313Y is examined to determine whether or not the value thereof is 1 indicating that the supplied Y address has been confirmed as an address to be masked. If either of the X and Y addresses has been confirmed as an address to be masked, the pair of X and Y addresses is discarded. The confirmation of an address as an address to be masked is referred to hereafter as a mask confirmation and an address completing a mask confirmation is referred to hereafter as a mask address.

(3) If the pair of supplied X and Y addresses is not discarded in processes (1) and (2), the address pair is stored in a pair of free address storage locations 311X and 311Y, and the existence bit 312 associated with the address storage location pair is set to 1. If the same value as the X address was stored at another X-address storage location 311X in the past, however, the XD bit 314X is also set to 1 to indicate that this X address has already been stored at the other X-address storage location 311X before. Otherwise, if the same value as the Y address was stored at another Y-address storage location 311Y in the past, the YD bit 314Y is also set to 1 to indicate that this Y address has already been stored at the other Y-address storage location 311Y before.

(4) A particular XD bit 314X already set at 1 reveals that a particular X address stored at this particular X-address storage location 311X is the same as an X address stored at another X-address storage location 311X. Thus, if the received X address is the same as the particular X address, the received X address would be stored for the third time. In this case, the X address is confirmed as a mask address by setting the X-mask bit 313X associated with this particular X-address storage location 311X to 1 indicating that the X address has been confirmed as a mask address, and the supplied pair of X and Y addresses is discarded. By the same token, a particular Y-mask bit 313Y already set at 1 reveals that a particular Y address stored at this particular Y-address storage location 311Y is the same as a Y address stored at another Y-address storage location 311Y. Thus, if the received Y address is the same as the particular Y address, the received Y address would be stored for the third time. In this case, the Y address is confirmed as a mask address by setting the Y-mask bit 313Y associated with this particular Y-address storage location 311Y to 1 indicating that the Y address has been confirmed as a mask address, and the supplied pair of X and Y addresses is discarded.

(5) If all the address storage locations 311X and 311Y are found already filled up or no storage area is found in an attempt to store a pair of supplied X and Y addresses in any pair of address storage locations 311X and 311Y, a repair is determined to be impossible. In this case, the overflow bit 315 is set to 1 to indicate an overflow (unrepairable) state and the repair-search circuit 31 completes execution of the series of processes described above.

The series of processes carried out by the repair-search circuit 31 as described above is explained in more detail by giving numerical examples. Consider a case in which the BIST circuit 20 detects abnormal bits in the redundant block 11, and then supplies pairs of X and Y addresses indicating the positions of the abnormal bits sequentially one pair after another to the repair-search circuit 31. In this case, assume that the pairs of X and Y addresses are (12, 5), (6, 5), (12, 8), (5, 35), (12, 6), (6, 35) and (7, 5).

First of all, when the repair-search circuit 31 receives the X and Y addresses of (12, 5), the X and Y addresses are stored at the X-address storage location 311X and the Y-address storage location 311Y respectively as they are since they are a first received pair of X and Y addresses. At that time, the existence bit 312 is set to 1 to indicate that valid X and Y addresses have been stored at the X-address storage location 311X and the Y-address storage location 311Y respectively.

Next, when the repair-search circuit 31 receives the X and Y addresses of (6, 5), the X and Y addresses are stored at the X-address storage location 311X and the Y-address storage location 311Y respectively as they are since they have not been stored at any pair of X-address storage location 311X and Y-address storage location 311Y yet before as a pair of addresses, and neither the X address nor the Y address has been confirmed as a mask address. At that time, the existence bit 312 is set to 1 to indicate that valid X and Y addresses have been stored at the X-address storage location 311X and the Y-address storage location 311Y respectively. In addition, the YD bit 314Y is set to 1 to indicate that the Y address of 5 was stored at another Y-address storage location 311Y before.

Next, when the repair-search circuit 31 receives the X and Y addresses of (12, 8), the X and Y addresses are stored at the X-address storage location 311X and the Y-address storage location 311Y respectively as they are since they have not been stored at any pair of X-address storage location 311X and Y-address storage location 311Y yet before as a pair of addresses, and neither the X address nor the Y address has been confirmed as a mask address. At that time, the existence bit 312 is set to 1 to indicate that valid X and Y addresses have been stored at the X-address storage location 311X and the Y-address storage location 311Y respectively. In addition, the XD bit 314X is set to 1 to indicate that the X address of 12 was stored at another X-address storage location 311X before.

Next, when the repair-search circuit 31 receives the X and Y addresses of (5, 35), the X and Y addresses are stored at the X-address storage location 311X and the Y-address storage location 311Y respectively as they are since they have not been stored at any pair of X-address storage location 311X and Y-address storage location 311Y yet before as a pair of addresses, and neither the X address nor the Y address has been confirmed as a mask address. At that time, the existence bit 312 is set to 1 to indicate that valid X and Y addresses have been stored at the X-address storage location 311X and the Y-address storage location 311Y respectively.

Next, the repair-search circuit 31 receives the X and Y addresses of (12, 6). The X address of 12 has already been stored at 2 X-address storage locations 311X as evidenced by the value of 1 set in the XD bit 314X associated with the pair of address storage locations for storing the X and Y addresses of (12, 8). Thus, the X address of 12 of the received X and Y addresses of (12, 6) would be stored for the third time. That is to say, there are 3 address pairs having the same X address of 12 but different Y addresses. In this case, this received pair of (12, 6) is discarded, and the X-mask bit 313X associated with the pair of address storage locations for storing the X and Y addresses of (12, 8) for which the XD bit 314X has been set at 1 is also set to 1 to confirm the X address of 12 as a mask address.

Next, when the repair-search circuit 31 receives the X and Y addresses of (6, 35), the X and Y addresses are stored at the X-address storage location 311X and the Y-address storage location 311Y respectively as they are since they have not been stored at any pair of X-address storage location 311X and Y-address storage location 311Y yet before as a pair of addresses, and neither the X address nor the Y address has been confirmed as a mask address. At that time, the existence bit 312 is set to 1 to indicate that valid X and Y addresses have been stored at the X-address storage location 311X and the Y-address storage location 311Y respectively. In addition, the XD bit 314X is set to 1 to indicate that the X address of 6 was stored at another X-address storage location 311X before, being stored currently for the second time. By the same token, the YD bit 314Y is set to 1 to indicate that the Y address of 35 was also stored at another X-address storage location 311X before, being stored currently for the second time.

Finally, the repair-search circuit 31 receives the X and Y addresses of (7, 5). The Y address of 5 has already been stored at 2 Y-address storage locations 311Y as evidenced by the value of 1 set in the YD bit 314Y associated with the pair of address storage locations for storing the X and Y addresses of (6, 5). Thus, the Y address of 5 of the received X and Y addresses of (7, 5) would be stored for the third time. That is to say, there are 3 address pairs having the same Y address of 5 but different X addresses. In this case, this received pair of (7, 5) is discarded, and the Y-mask bit 313Y associated with the pair of address storage locations for storing the X and Y addresses of (6, 5) for which the YD bit 314Y has been set at 1 is also set to 1 to confirm the Y address of 5 as a mask address.

As described above, the BIST circuit 20 detects abnormal bits in the redundant block 11, and then supplies pairs of X and Y addresses (12, 5), (6, 5), (12, 8), (5, 35), (12, 6), (6, 35) and (7, 5) indicating the positions of the abnormal bits sequentially one pair after another to the repair-search circuit 31. In this case, as a result of the processing carried out by the repair-search circuit 31, the X-address storage locations 311X, the Y-address storage locations 311Y and the other bits 312 to 315 in the repair-search circuit 31 are set to values shown in FIG. 5.

By creating the BIST circuit 20 and the repair-search circuit 31 in the same LSI chip as the RAM 10, the processes described above can be carried out at a high LSI operating speed. In one of the processes, if an abnormal bit is detected, the address of the abnormal bit is identified. In another process, address information is confirmed as a smallest amount of address information required to determine which redundant line is to be used for repairing the abnormal bit, and only the confirmed address information is stored at mainly the X-address storage locations 311X and the Y-address storage locations 311Y besides the other bits including the X mask bits 313X and Y mask bits 313Y as shown in FIG. 4. As a result, an expensive memory tester capable of carrying out operations at a high speed equal to the LSI operating speed is no longer required.

In addition, the semiconductor memory apparatus has a configuration in which the on-chip process carried out by the repair-search circuit 31 leaves only information on addresses of abnormal bits as information required for an analysis of redundant lines. Thus, it is not necessary to store information on normalcy or abnormality for each address as is the case with the conventional semiconductor memory apparatus. As a result, the size of the buffer unit 311 can be reduced considerably. In addition, the speed of a computation to determine a redundant line to be used for repairing an abnormal memory cell can also be raised as well.

The BISR circuit 30 uses the function of the repair-search circuit 31 as described above to carry out an on-chip repair search in order to determine a mask address even if redundant lines are connected to a plurality of redundant blocks in a spit-form direction. In typical embodiments of the BISR circuit 30, row redundant lines 14 are connected to 4 redundant blocks 11 in a spit-form direction.

FIRST EMBODIMENT

Figure 6:
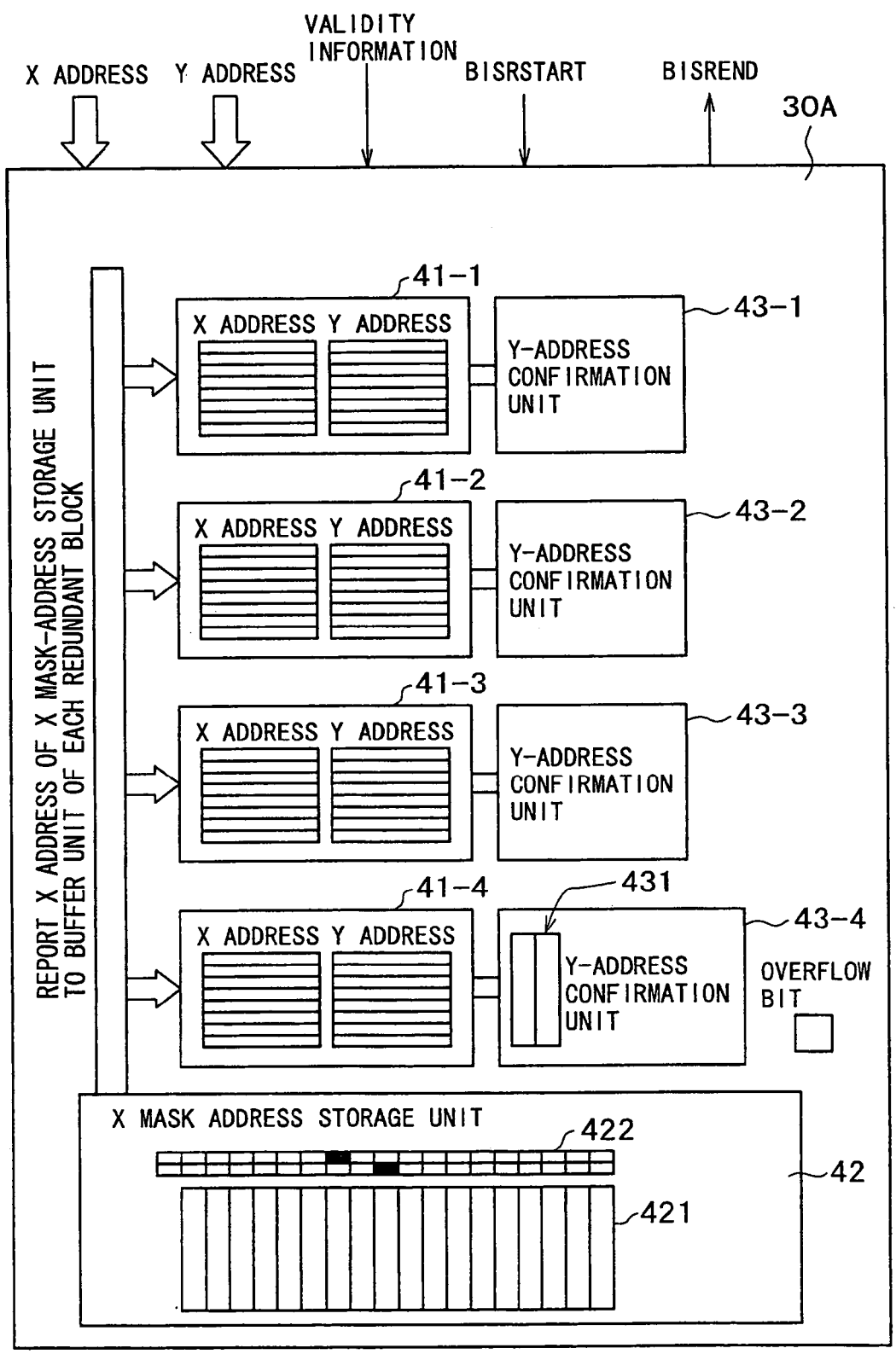
FIG. 6 is a block diagram concretely showing a typical configuration of a BISR circuit implemented by a first embodiment.

FIG. 6 is a block diagram showing a typical configuration of a BISR circuit 30A provided by a first embodiment. As shown in FIG. 6, the BISR circuit 30A implemented by the first embodiment includes buffer units 41-1 to 41-4 each including address-pair storage locations and flags, an X-mask-address storage unit 42 and Y-address confirmation units 43-1 to 43-4. An overflow bit is a BISR result indicating whether or not the address of an abnormal bit is repairable.

When the BIST circuit 20 finishes an evaluation process to determine whether each memory cell is normal or abnormal, the BIST circuit 20 supplies a BISRSTART start signal to start a BISR computation to the BISR circuit 30A. Receiving the BISRSTART start signal, the BISR circuit 30A starts the BISR computation. As the BISR computation is finished, the BISR circuit 30A outputs a BISREND end signal indicating that the BISR computation has been finished.

In the configuration shown in FIG. 6, each of the buffer units 41-1 to 41-4 corresponds to the repair-search circuit 31 included in the configuration shown in FIG. 4. That is to say, the buffer units 41-1 to 41-4 each carry out the repair search described earlier in order to store only fewest possible pairs of X and Y addresses required for determining redundant lines to be used to repair abnormal memory cells for 4 redundant blocks 11. It is to be noted that, while the Y-address confirmation units 43-1 to 43-4 are provided externally to the buffer units 41-1 to 41-4 respectively, they can also be provided inside the buffer units 41-1 to 41-4 respectively.

The X-mask-address storage unit 42 has a X-address storage unit 421 and a shift-register unit 422. As an example, consider a case in which 2 row redundant lines 14 are connected to the redundant blocks 11 in the Y direction (a spit-form direction) whereas 2 column redundant lines 15 are connected to each of the redundant blocks 11 in the Y direction as shown in FIG. 3. In this case, since the maximum number of values that the X address can have is 18, 18 X-address storage locations in the X-address storage unit 421 employed in the X-mask-address storage unit 42 are sufficient.

The following description explains the reasoning leading to a conclusion that the maximum number of values that the X address can have is 18. All the values of the X address are used when the 2 row redundant lines 14 in the Y direction are used, requiring 2 values of the X address in the Y direction and, in addition, 2 column redundant lines 15 connected in the X direction per redundant block 11 are used. In this case, since 2 values of the X address per column redundant line 15 are supplied to the buffer units 41-1 to 41-4, the number of X-address values per redundant block 11 is 4 (=2×2). Since the number of redundant blocks 11 is 4, the total number of X-address values is 16. In addition, the number of X-address values in the Y direction is 2. Thus, the grand total number of X-address values is 18. If the number of X-address values 19 or more, a repair work is impossible.

The shift-register unit 422 has as many shift registers as row redundant lines 14 connected in the Y direction. Since the number of row redundant lines 14 connected in the Y direction is 2, the shift-register unit 422 has 2 shift registers. The shift registers need to have only as many shift stage bits as the X-address storage locations in the X-address storage unit 421 or only as many shift stage bits as the values that the X address can possibly have at the most. Since the maximum number of values that the X address can have at the most is 18, the shift-register unit 422 has a configuration requiring only 18 shift stage bits. In this embodiment, however, the shift-register unit 422 has an additional shift stage bit at the left end in its configuration to give a total of 19 shift stage bits. The additional shift stage bit is used to indicate a state in which a mask address is not used. The phrase stating: "a mask address is not used" means "the redundant lines connected in the Y direction are not used."

The Y-address confirmation units 43-1 to 43-4 are used to confirm Y addresses of address pairs, which are left without undergoing mask confirmations of X addresses thereof. In order to confirm a Y address, each of the Y-address confirmation units 43-1 to 43-4 has a Y-address storage unit 431 including Y-address storage locations each used for storing a Y address. Since 2 column redundant lines 15 are connected to each redundant block 11 in the X direction, 2 Y addresses need to be stored in each of the Y-address confirmation units 43-1 to 43-4. Thus, each of the Y-address confirmation units 43-1 to 43-4 has a Y-address storage unit 431, which includes 2 Y-address storage locations.

The following description explains a concrete processing procedure executed in the BISR circuit 30A with the configuration described above to determine a mask address. The processing described below is carried out under control executed by the BISR control unit 32 included in the configuration shown in FIG. 1.

(1) First of all, the BIST circuit 20 is operated to store only fewest possible pairs of abnormal-bit addresses in the buffer units 41-1 to 41-4 as a smallest amount of information required in the repair search function of the repair-search circuit 31 to determine a redundant line to be used for each of the 4 redundant blocks 11.

(2) Next, X addresses of X-Y address pairs stored in all the buffer units 41-1 to 41-4 as X addresses of abnormal memory cells are transferred to the X-mask-address storage unit 42. At that time, an attempt is made to store X addresses all different from each other.

(3) Next, pointers of the 2 shift registers of the shift-register unit 422 in the X-mask-address storage unit 42 are moved to the left ends of the shift registers in FIG. 6. The state in which the pointers are positioned at the left ends is referred to as a reset state. This reset state in which the pointers of the 2 shift registers of the shift-register unit 422 are positioned at the leftmost shift stage bits of the shift registers is a state in which an X mask address is not used. That is to say, in this reset state, the row redundant lines 14 connected in the Y direction are not used.

(4) Next, first of all, the X-mask-address storage unit 42 determines whether or not each redundant block can be masked in this reset state. Since the row redundant lines 14 connected in the Y direction are not used in this reset state, the Y-address confirmation units 43-1 to 43-4 of the buffer units 41-1 to 41-4 each determine whether or not a redundant block can be masked by using only a Y mask address. The phrase stating: "using only a Y mask address" means "using only the 2 column redundant lines 15 connected to each unit block in the X direction." If a redundant block cannot be masked by using only a Y mask address, the next process is carried out.

(5) If a redundant block cannot be masked by using only a Y mask address, the pointer of the lower shift register is shifted to the right. If the X-address storage location included in the X-address storage unit 421 as a location pointed to by a combination of the pointer of the lower shift register and the pointer of the upper shift register contains an X address, the X address is reported to the buffer units 41-1 to 41-4. Any address pair included in any of the buffer units 41-1 to 41-4 as an address pair having the same X address as the reported X address is repaired by using this X address. A repaired address pair is marked. A repaired address pair can be marked by, for example, setting a special bit, which is newly added to every address-pair storage location in each of the buffer units 41-1 to 41-4.

(6) Next, the Y-address confirmation units 43-1 to 43-4 associated with the buffer-units 41-1 to 41-4 respectively determine whether or not address pairs, which are not repaired in process (5) described above and thus remain to be repaired in each of the buffer units 41-1 to 41-4, can be masked by using the 2 column redundant lines 15 connected in the X direction. If the remaining address pairs cannot be masked, the following process is carried out.

(7) If the remaining address pairs cannot be masked in process (6) described above, the pointer of the lower shift register is shifted to the right to repeat process (5). Then, process (6) to determine whether or not the remaining address pairs can be masked by using the 2 column redundant lines 15 connected in the X direction is carried out again. In this way, processes (5) and (6) are repeated. If the remaining address pairs cannot be masked yet even after the pointer of the lower shift register is shifted to the right end, the pointer of the upper shift register is shifted to the right. At that time, the pointer of the lower shift register may be taken back to the left end to start the right shift operation of the lower shift register from the beginning to repeat process (5). As an alternative, the start of the right shift operation of the lower shift register may be the same shift stage position as the pointer of the upper shift register or a shift stage position adjacent to the shift stage position of the upper shift register on the right side of the shift stage position of the upper shift register. Then, by assuming that each of address pairs stored in any of the buffer units 41-1 to 41-4 as a pair including an X address pointed to by a combination of the newly positioned pointer of the upper shift register and the pointer of the lower shift register has been repaired by using the row redundant lines 14 connected in the Y direction in process 5, the remaining address pairs are examined to determine whether or not they can be masked by using the 2 column redundant lines 15 connected in the X direction in process 6.

(8) Thereafter, the processes are carried out in the same way. If address pairs of all abnormal memory cells can be masked for the 4 redundant blocks 11 at a time in the course of the processes, at that time, an X address stored at any X address storage location pointed to by the pointers of the 2 shift registers, i.e., the lower and upper shift registers of the shift-register unit 422, becomes an X mask address. If address pairs of all abnormal memory cells cannot be masked even if the processes are all carried out to the end, an unmaskable state results.

(9) In order to determine whether or not an address pair can be repaired by a set of X mask addresses stored at X address storage locations pointed to by the pointers of the 2 shift registers on the upper and lower sides of the shift-register unit 422, the following operation is carried out. A Y address of a remaining address pair with the X address thereof not confirmed as a mask address is transferred to the Y-address storage locations of the Y-address storage unit 431 for each redundant block sequentially. If the same Y address has already been stored at a Y-address storage location in the Y-address storage unit 431, the Y address being transferred is discarded. If 2 different Y addresses are transferred to the 2 Y-address storage locations of the Y-address storage unit 431 as a result of the transfer operation, the redundant block is determined to be a block that can be masked by using the 2 column redundant lines 15 connected in the X direction. If 2 different Y addresses are not transferred to the 2 Y address storage locations in Y-address storage unit 431 as a result of the transfer operation, on the other hand, the redundant block is determined to be a block that cannot be masked by using the 2 column redundant lines 15 connected in the X direction.

In this embodiment, the upper and lower shift registers of the shift-register unit 422 each have 19 shift stage bits with the leftmost shift stage bit indicating a state in which the row redundant lines 14 connected in the Y direction are not used. However, it is also possible to provide a configuration in which the upper and lower shift registers of the shift-register unit 422 can each have only 18 shift stage bits. With the upper and lower shift registers of the shift-register unit 422 each having only 18 shift stage bits, however, the row redundant lines 14 connected in the Y direction are always used. In addition, in this case, addresses eventually remaining in the Y-address storage locations of the Y-address storage unit 431 employed in each of the Y-address confirmation units 43-1 to 43-4 are each a Y mask address.

In the first embodiment described above, only 2 row redundant lines 14 are connected to all redundant blocks 11 in the Y direction (the spit-form direction) whereas 2 column redundant lines 15 are connected to each of the redundant blocks 11 in the X direction as shown in FIG. 3. It is to be noted, however, that the configuration of the present invention is not limited to this embodiment. For example, the present invention can also be applied as well to a configuration in which, reversely, 2 row redundant lines 14 are connected to each of redundant blocks 11 in the Y direction whereas only 2 column redundant lines 15 are connected to all the redundant blocks 11 in the X direction (the spit-form direction). In addition, the number of row redundant lines 14 and the number of column redundant lines 15 do not have to be 2. These different ways to connect redundant lines and different redundant-line counts also apply to embodiments to be described later as well.

If the number of redundant lines is not 2, however, the maximum number of values that the X address or the Y address can have also changes as well. Of course, the number of X-address storage locations in the X-address storage unit 421 and the number of shift stage bits of the upper and lower shift registers in the shift-register unit 422 also change to a number according to the maximum number of values. In addition, if the number of row redundant lines 14 connected in the Y direction is at least 3, the shift-register unit 422 also includes as many shift registers as the row redundant lines 14. If at least 3 shift registers compose the shift-register unit 422, let the shift registers of the shift-register unit 422 be referred to as a first shift register, a second shift register, a third shift register and so on. In this case, the pointers of the shift registers are each shifted to the right in a way similar to the upper-side and lower shift registers of the shift-register unit 422 in the configuration shown in FIG. 6 described earlier. That is to say, with a pointer of the first shift register fixed, after pointers of the second shift registers, the third shift registers and so on are shifted to the right ends, the pointer of the first shift register is shifted by 1 bit. After the pointer of the first shift register is shifted by 1 bit, an operation to shift the pointer of the second shift register is started from a shift-stage position coinciding with a new shift-stage position of the pointer of the first shift register or a shift-stage position immediately following the new shift-stage position of the pointer of the first shift register. By the same token, an operation to shift the pointer of the third shift register is started from a shift-stage position coinciding with the start shift-stage position of the pointer of the second shift register or a shift-stage position immediately following the start shift-stage position of the pointer of the second shift register. In this way, it is possible to produce all combinations of X addresses without generating each of the combinations more than once. In this way, the time it takes to carry out a repair search can be shortened.

SECOND EMBODIMENT

Figure 7:
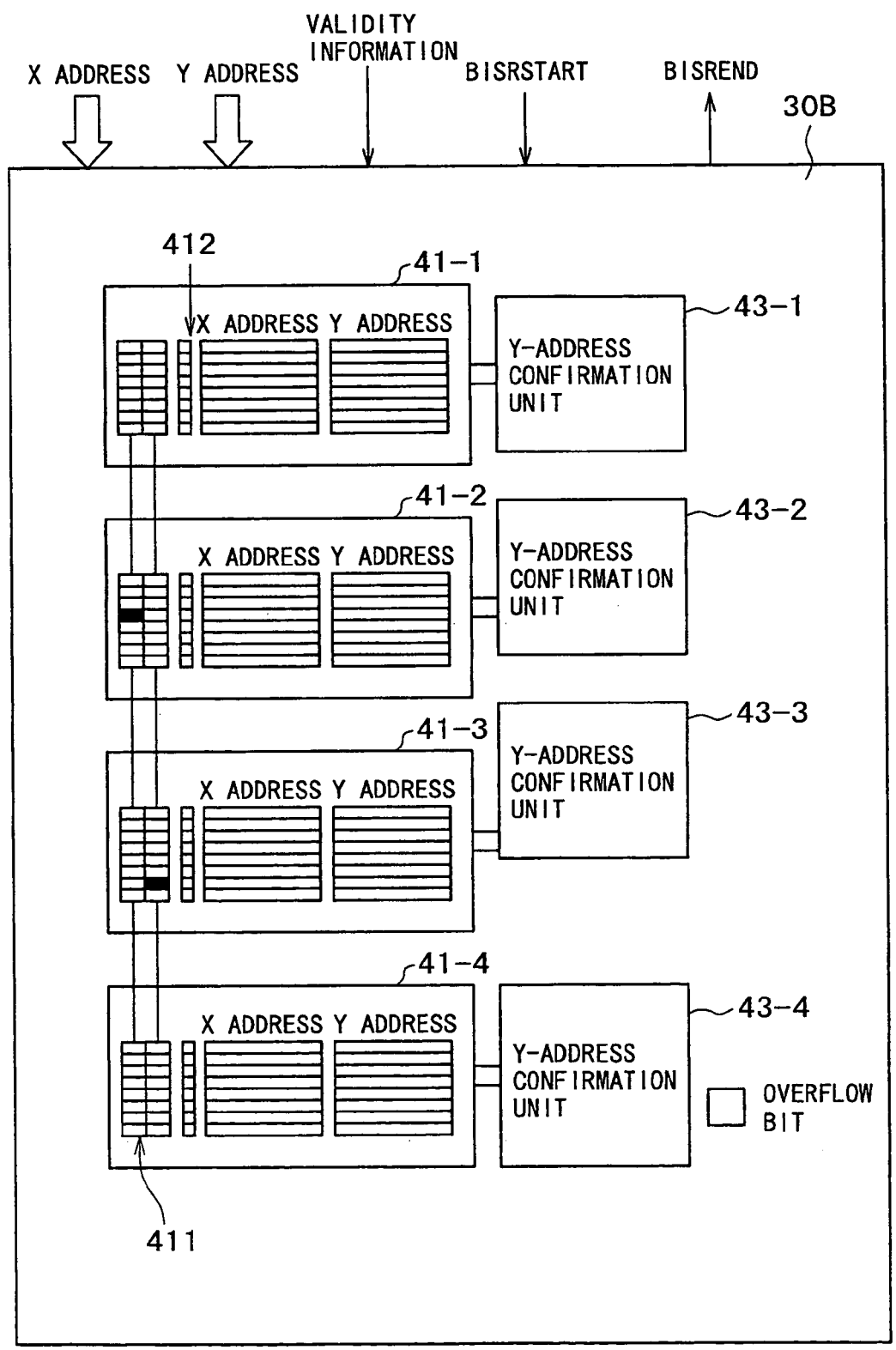
FIG. 7 is a block diagram concretely showing a typical configuration of a BISR circuit implemented by a second embodiment.

FIG. 7 is a block diagram showing a typical configuration of a BISR circuit 30B implemented by a second embodiment. Components employed in the second embodiment as components identical with their counterparts included in the first embodiment shown in FIG. 6 are denoted by the same reference numerals as the counterparts. As is obvious from FIG. 7, the BISR circuit 30B includes buffer units 41-1 to 41-4 and Y-address confirmation units 43-1 to 43-4. Each of the buffer units 41-1 to 41-4 has address-pair storage locations each used for storing a pair of addresses and has flags associated with the address-pair storage locations. In each of the buffer units 41-1 to 41-4, flags associated with a particular address-pair storage location are linked to flags associated with address-pair storage locations adjacent to the particular address-pair storage location in a chain connection to form shift registers. As many such shift registers as row redundant lines 14 connected in the in the Y direction are included in each of the buffer units 41-1 to 41-4. In this embodiment, the number of row redundant lines 14 connected in the Y direction is 2. The 2 shift registers in any particular one of the buffer units 41-1 to 41-4 are also connected to the 2 shift registers in other buffer units adjacent to the particular buffer unit to form left and right shift registers spread over all the buffer units 41-1 to 41-4. These left and right shift registers form a shift register unit 411. In addition, each of the buffer units 41-1 to 41-4 has XD bits 412 each associated with one of the address-pair storage locations. The XD bits 412 are the same as the XD bits 314X included in the configuration shown in FIG. 4 described earlier.

The following description explains a concrete processing procedure executed by the BISR circuit 30B with the configuration described above in determining a mask address. The processing described below is carried out under control executed by the BISR control unit 32 included in the configuration shown in FIG. 1.

(1) First of all, the BIST circuit 20 is operated to store only fewest possible pairs of abnormal-bit addresses in the buffer units 41-1 to 41-4 as a smallest amount of information required in the repair search function of the repair-search circuit 31 to determine a redundant line to be used for each of the 4 redundant blocks 11.

(2) Next, pointers of the left and right shift registers of the shift register unit 411 in the buffer units 41-1 to 41-4 are positioned to the upper ends to establish a reset state. Much like the first embodiment, each of the left and right registers of the shift register unit 411 may be provided with a 1-set flag at a shift stage bit position above the upper end as a flag for indicating a special state in which the row redundant lines 14 connected in the Y direction are not used. Not shown in FIG. 7, this 1-set flag thus allows this special state to be taken into consideration.

(3) Next, in this state, an X address pointed to by the pointers of the left and right shift registers is reported to all the buffer units 41-1 to 41-4 to be compared with the corresponding X addresses in the buffer units 41-1 to 41-4. It is then assumed that an address pair including the same X address as the reported one is repaired. Much like the first embodiment, a bit can be added to each of the address-pair storage locations in the buffer units 41-1 to 41-4 as a dedicated bit used for indicating whether or not an address pair stored at the individual address-pair storage location has been repaired.

(4) Next, a process is carried out to determine whether or not an address pair that cannot be repaired in process (3) can be masked by using the column redundant lines 15 connected in the X direction. If the address pair cannot be masked, the next process is carried out.

(5) Next, the pointer of the right shift register is shifted down. If the pointer at the new position points to an XD bit 412 already set at 1 indicating that the X-address of an address pair at the address-pair storage location associated with the XD bit 412 has been stored also at another address-pair storage location, the new position is ignored and the pointer is shifted down again.

(6) An X address pointed to by a combination of the pointer positions of the left and right shift registers are reported to all the buffer units 41-1 to 41-4 to be compared with the corresponding X addresses in the buffer units 41-1 to 41-4. It is then assumed that each address pair including the same X address as the reported one is repaired.

(7) Next, the Y-address confirmation units 43-1 to 43-4 associated with the buffer units 41-1 to 41-4 respectively are used determine whether or not remaining address pairs that cannot be repaired in process (6) can be masked by using the column redundant lines 15 connected in the X direction. The algorithm used in the determination is the same as that adopted in the first embodiment. If a remaining address pair cannot be masked, the following process is carried out.

(8) The pointer of the right shift register is further shifted down in the same way as process (5) to give a new combination of pointer positions before repeating processes (6) and (7). The operation to produce the new combination of pointer positions before repeating processes (6) and (7) is carried out as follows. After the pointer of the right shift register has been shifted to the lower end, the pointer of the left shift register is shifted down. Much like the right shift register in process (5), if the pointer of the left shift register at the new position points to an XD bit 412 already set at 1 indicating that the X-address of an address pair at the address-pair storage location associated with the XD bit 412 has been stored also at another address-pair storage location, the new position is skipped and the pointer of the left shift register is shifted down again. After the pointer of the left shift register has been shifted, the pointer of the right shift register is positioned back to the upper end. As an alternative, the pointer of the right shift register is shifted upward to a position corresponding to the new position of the left shift register or a position right below the new position.

(9) For every new pointer-position combination generated in process (8) by shifting down the left register as described above, process (6) explained above is carried out to determine whether each address pair can be repaired, and process (7) is performed to determine whether or not each remaining address pair can be masked as described above. If a remaining address pair can be masked, the X address pointed to by the combination of pointer positions of the left and right shift registers is taken as an X mask address. If remaining address pairs cannot be masked for all combinations of pointer positions, an unmaskable state results.

The same X address may be stored at a plurality of address-pair storage locations in any of the buffer units 41-1 to 41-4. In this case, however, the XD bit 412 is used to prevent the same X address from being accessed 2 times as described above. If the same X address is stored at a plurality of address-pair storage locations spread over at least 2 of the buffer units 41-1 to 41-4, however, it is not possible to avoid the operation to make accesses to the same X address stored at the different address-pair storage locations. By reporting X addresses pointed to by a new combination of pointer positions, which are obtained right after any of the left and right shift registers in the shift register unit 411 is shifted, to not only a particular buffer unit, but all the buffer units 41-1 to 41-4 and setting the XD bit 412 associated with address-pair storage locations for storing an address pair including the same X address as one of the reported X addresses in advance, nevertheless, the same X address will not be accessed twice.

THIRD EMBODIMENT

In the case of the first and second embodiments, as the Y-address storage unit 431 employed in each of the Y-address confirmation units 43-1 to 43-4 as a unit for confirming Y addresses, 2 Y-address storage locations are provided. In the case of a third embodiment, Y shift registers 413 are employed as shown in FIG. 8 in place of the Y-address storage unit 431. The Y shift registers 413 are used for implementing a method to confirm Y addresses in accordance with the third embodiment.

To put it concretely, as many Y shift registers 413 as column redundant lines 15 connected in the X directions are employed. In the case of the third embodiment, the number of Y shift registers 413 is 2. Pointers of the Y shift registers 413 are each shifted at one time. If a Y address stored at a Y-address storage location pointed to by a combination of pointer positions is the same as the Y address stored at an address pair in the buffer units 41-1 to 41-4, the address pair is masked. A masked address pair is indicated by a Y-test mask bit 414 added to each address pair. Before the operation to shift the Y shift registers 413 is started, the Y-test mask bits 414 are all cleared.

When all address pairs are masked at a time by X mask addresses and Y mask addresses, at that time, any Y addresses stored at Y-address storage locations pointed to by combinations of pointer positions of the Y shift registers 413 are taken as a confirmed Y mask addresses. The pointers of the Y shift registers 413 are shifted in the same way as the pointers of the upper and lower shift registers employed in the first embodiment and the pointers of the left and right shift registers employed in the second embodiment. In addition, if any address pair masked by using an X mask address is skipped in the operation to confirm a Y address, the operation can be carried out with a high degree of efficiency.

FOURTH EMBODIMENT

Figure 9A:
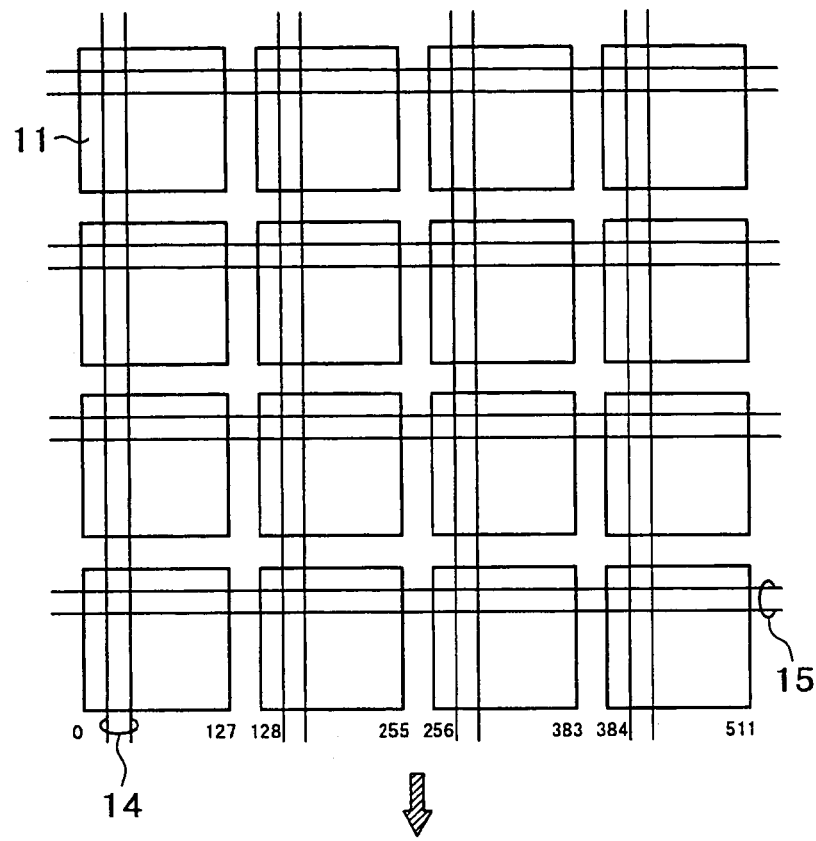
FIGS. 9A and 9B are explanatory diagrams referred to in describing a process carried out by a fourth embodiment implementing a BISR.

In the case of the first to third embodiment, 2 row redundant lines 14 are connected to all redundant blocks 11 in the Y direction (the spit-form direction) whereas 2 column redundant lines 15 are connected to each of the redundant blocks 11 in the X direction as shown in FIG. 3. In the case of the fourth embodiment, however, the row redundant lines 14 and the column redundant line 15 are both connected to all redundant blocks 11 in a spit form in both the X and Y directions, that is, two dimensionally in a spit form as shown in FIG. 9A. As an example, the row redundant lines 14 and the column redundant line 15 are both connected to 4 redundant blocks 11 in a spit form in both in the X and Y directions.

Figure 9B:
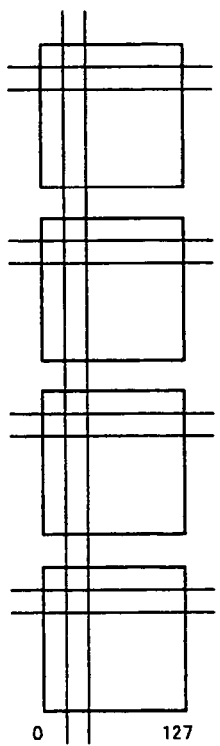

In such a two-dimensional spit-form structure, for the 4 redundant blocks laid out in the X direction, the 4 redundant blocks laid out in the X direction can be dealt with collectively with respect to the X address as a block so that the structure appears like one shown in FIG. 9B.

To put it concretely, let X addresses assigned to the redundant blocks on the leftmost side be 0 to 127, X addresses assigned to the redundant blocks on an array adjacent to the leftmost side be 128 to 255, X addresses assigned to the redundant blocks on an array adjacent to the rightmost side be 256 to 383 and X addresses assigned to the redundant blocks on the rightmost side be 384 to 511 as shown in FIG. 9A. In this case, in an operation to supply an address of an abnormal (defective) bit to the BISR circuit 30, a remainder obtained as a result of dividing an X address by 128 is actually given to the BISR circuit 30 as a substitute for the X address so that it is necessary to merely supply an address having a value in the range 0 to 127 for all the redundant blocks laid out in the X direction as shown in FIG. 9B to the BISR circuit 30 as the address of an abnormal bit.

As described above, the X address of an abnormal bit in for the 4 redundant blocks laid out in the X direction is converted into a substitute address having a value in the range 0 to 127 and the substitute address is supplied to the BISR circuit 30. Thus, even in the case of a memory having a structure in which the row redundant lines 14 and the column redundant line 15 are both connected to a plurality of redundant blocks 11 in two-dimensional directions to generate a spit form in both the directions, an on-chip repair search can be carried out to determine mask addresses in the same way as the first to third embodiments.

The above description has explained a method to handle the 4 redundant blocks laid out in the X direction collectively through address conversion. It is to be noted, however, that the method can also be applied to the 4 redundant blocks laid out in the Y direction collectively. In addition, the method is also applicable to cases in which the number of redundant blocks is not 4.

While preferred embodiments of the present invention have been described using specific terms, such description is for illustrative purpose only, and it is to be understood that changes and variations may be made without departing from the spirit or scope of the following claims.

What is claimed is:

1. A semiconductor memory apparatus comprising:
a memory unit having a plurality of unit blocks, wherein each unit block includes:
a memory core including a plurality of memory cells laid out to form a cell matrix; and
redundant lines including redundant memory cells each used for repairing an abnormal memory cell generated in any of said memory cores,
wherein
said plurality of unit blocks form a block matrix or a plurality of block matrixes, and each of said plurality of unit blocks forms a one-dimensional group oriented in a first direction (row or column direction) or a second direction (column or row direction); and
said redundant lines are shared by a group of said plurality of unit blocks, wherein the group of said plurality unit blocks have a common orientation of said one-dimensional group;
self-test means for evaluating said memory cells to determine whether said memory cells are abnormal, wherein said self-test means is mounted in the same chip as said memory unit; and
self-repair means for receiving address pairs associated with an abnormal memory cell from said self-test means,
selecting a minimum number of address pairs of the plurality of address pairs received from said self-test means, wherein each address pair includes a first-direction address (row or column address) and a second-direction address (column or row address) associated with the abnormal memory cell,
storing said selected minimum number of address pairs in first storage means for each of said plurality of unit blocks required to determine a redundant line to be used to repair the abnormal memory cell; and
finding a redundant line to repair the abnormal memory cell based on address pairs stored in said first storage means.

2. The semiconductor memory apparatus according to claim 1, wherein:
said self-repair means has a first storage unit and a first shift-register unit;
said first storage unit is capable of storing a maximum number of second-direction addresses selected from the address pairs stored in said first storage means for each unit block in said group of unit blocks of said one-dimensional group, wherein each unit forms said one-dimensional group commonly oriented in said second direction and said redundant lines connected in said second direction are shared by each unit block of said one-dimensional group;

said first shift-register unit has a plurality of shift registers, wherein the number of the plurality of shift registers equals the number of said redundant lines connected in said second direction;

each of said shift registers has as many shift stage bits as said maximum number; and said first shift-register unit sequentially points to one of said second-direction addresses stored in said first storage unit by shifting the plurality of shift registers; and said first shift-register unit generates an address set of said second-direction address for each unit block by operating only one of said plurality of shift registers at a time.

3. The semiconductor memory apparatus according to claim 2, wherein:

the address set generated as an address set of a second-direction address is reported for each unit block and, if the address pair including said second-direction address exists in said first storage means, said address pair is an address pair that can be repaired by using a redundant line connected in said second direction; and if an address pair remaining in said first storage means is unrepaired, said remaining address pair is examined to determine whether said remaining address pair is repairable by using a redundant line connected in said first direction.

4. The semiconductor memory apparatus according to claim 3, wherein:

as means to determine whether or not it is possible to use a redundant line connected in said first direction for repairing the remaining address pair that cannot be repaired by using a redundant line connected in said second direction, said self-repair means includes a plurality of second storage units that store a first-direction address, wherein a number of said second storage units equals a number of said redundant lines connected to each unit block in said first direction; and said self-repair means executes the steps of:

supplying a first-direction address of the remaining address pair that cannot be repaired by using a redundant line connected in said second direction to said second storage units;

discarding said first-direction address of said remaining address pair when said first-direction address has already been stored in said second storage units;

determining that said remaining address pair can be repaired by using a redundant line connected in said first direction when said first-direction address is stored in said second storage units; and determining that said remaining address pair cannot be repaired by using a redundant line connected in said first direction when said first-direction address is not stored in said second storage units.

5. The semiconductor memory apparatus according to claim 3, wherein:

as means to determine whether it is possible to use a redundant line connected in said first direction for repairing the remaining address pair that cannot be repaired by using a redundant line connected in said second direction, said self-repair means is provided with a plurality of first-direction shift registers wherein the number of first-direction shift registers corresponds to the number of redundant lines connected to each of said unit blocks in said first direction; and said self-repair means executes the steps of:

shifting at least one of said first-direction shift registers and taking a first-direction address pointed to by said first-direction shift registers as a first-direction repair address;

determining whether the remaining address pair that cannot be repaired by using a redundant line connected in said second direction, can be repaired by using a redundant line connected in said first direction as a redundant line corresponding to said first-direction repair address; and further shifting at least one of said first-direction shift registers and determining whether said remaining address pair can be repaired if said remaining address pair cannot be repaired by using said redundant line connected in said first direction.

6. The semiconductor memory apparatus according to claim 2, wherein said shift registers of said first shift-register unit each have an additional shift stage bit that indicates a state in which redundant lines connected in said second direction are ignored.

7. The semiconductor memory apparatus according to claim 2, wherein the plurality of said shift registers employed in said first shift-register unit include at least a first shift register, a second shift register, and a third register, wherein when said first shift register is fixed following a shift in said second shift register and said third shift register, said first shift register is shifted by 1 bit and an operation to shift said second shift register is started from a shift-stage position coinciding with a new shift-stage position of said first shift register or a shift-stage position immediately following said new shift-stage position of said first shift register, and an operation to shift said third shift register is started from a shift-stage position coinciding with said start shift-stage position of said second shift register or a shift-stage position immediately following said start shift-stage position of said second shift register.

8. The semiconductor memory apparatus according to claim 1, wherein each of said unit block forms a one-dimensional group in said second direction, and said first storage means includes a plurality of shift register flags associated with the address pairs stored in said first storage means, wherein the number of shift-register flags corresponds to the number of said redundant lines connected to each unit block commonly oriented in said second direction of said one-dimensional group;

wherein said plurality of shift-register flags are linked to each other to form a chain spread over each unit block as said redundant lines connected in said second direction;

wherein said plurality of shift registers form a second shift-register unit; and wherein an address set of said second-direction address is generated by successively shifting each shift register of said plurality of shift registers.

9. The semiconductor memory apparatus according to claim 8, wherein said plurality of shift registers of said second shift-register unit have an additional shift stage bit that indicates a state in which redundant lines connected in said second direction are ignored.

10. The semiconductor memory apparatus according to claim 8, wherein:

wherein said self-repair means has a duplication flag associated with each address pair of the plurality of address pairs stored in said first storage means;

wherein said duplication flags indicate that a corresponding address pair includes a second-direction address stored in at least two storage locations of said first storage means; and wherein when at least one of said plurality of shift registers of said second shift-register unit is shifted to a next shift stage position coinciding with one of said duplication flags, which have been put in a set state, said next shift stage position is ignored and said particular shift register is shifted again.

11. The semiconductor memory apparatus according to claim 10, wherein:
said self-repair means reports a second-direction address pointed to by said shift registers of said second shift-register unit for each unit block; and
when said reported second-direction address exists in said first storage means for at least two of said unit blocks, said duplication flag of one of said at least two unit blocks is set.

12. The semiconductor memory apparatus according to claim 8, wherein:
said self-repair means reports to each unit block a second-direction address pointed to by said second shift-register unit while shifting said second shift-register unit;
when a duplicate second-direction address of said reported second-direction address exists in said first storage means, said self-repair means determines that an address pair including said same second-direction address is a repairable address pair;
said self-repair means first determines whether a remaining address pair is repairable; and
said embedded self-repair means again shifts said second shift-register unit and again determine whether said remaining address pair are repairable when a remaining address pair cannot be repaired based on the first determination.

13. The semiconductor memory apparatus according to claim 8, wherein said self-repair means has a special flag for each address pair of the plurality of address pairs of each unit block stored in said first storage means to indicate that a second-direction address of at least one address pair associated with said special flag matches an address set of the second-direction address reported by said embedded self-repair means for each unit block and the at least one address pair is regarded as a second-direction repair address.

\* \* \* \* \*